US008975947B1

(12) United States Patent
Seshita

(10) Patent No.: US 8,975,947 B1
(45) Date of Patent: Mar. 10, 2015

(54) SHUNT SWITCH

(71) Applicant: Kabushiki Kaisha Toshiba, Tokyo (JP)

(72) Inventor: Toshiki Seshita, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/194,615

(22) Filed: Feb. 28, 2014

(30) Foreign Application Priority Data

Oct. 11, 2013 (JP) ................................. 2013-213713

(51) Int. Cl.
 *H03K 17/16* (2006.01)
(52) U.S. Cl.
 CPC .................................. *H03K 17/162* (2013.01)
 USPC ........................................ 327/379; 327/384
(58) Field of Classification Search
 USPC .................................................. 327/379, 384
 See application file for complete search history.

(56) References Cited

U.S. PATENT DOCUMENTS

| 5,912,599 | A  | * | 6/1999  | Beall          | 333/81 R  |
|-----------|----|---|---------|----------------|-----------|
| 6,489,856 | B1 | * | 12/2002 | Weigand        | 333/81 R  |
| 6,597,231 | B2 | * | 7/2003  | Tsutsumi       | 327/378   |
| 7,337,547 | B2 | * | 3/2008  | Yasuda et al.  | 333/103   |
| 7,436,237 | B2 | * | 10/2008 | Hikita et al.  | 327/379   |
| 7,636,004 | B2 | * | 12/2009 | Nakatsuka et al. | 327/308 |
| 8,320,843 | B2 | * | 11/2012 | Seshita et al. | 455/78    |
| 8,405,936 | B2 | * | 3/2013  | Ehlers et al.  | 361/1     |
| 2006/0252394 | A1 | * | 11/2006 | Suwa et al. | 455/201 |
| 2009/0181630 | A1 | * | 7/2009  | Seshita et al. | 455/191.3 |
| 2012/0112832 | A1 | * | 5/2012  | Kawano et al. | 330/124 D |
| 2014/0113680 | A1 | * | 4/2014  | Seshita | 455/550.1 |
| 2014/0176225 | A1 | * | 6/2014  | Ha et al. | 327/379 |

FOREIGN PATENT DOCUMENTS

| JP | 2005341485 A | 12/2005 |
|----|--------------|---------|
| JP | 2006050583 A | 2/2006  |
| JP | 2009194891 A | 8/2009  |

* cited by examiner

*Primary Examiner* — Thomas J Hiltunen
(74) *Attorney, Agent, or Firm* — Patterson & Sheridan, LLP

(57) ABSTRACT

A shunt switch includes first switching elements provided in series between a first node and a second node. Second switching elements are provided in series between the nodes but not in series with the first switching elements. A distortion generation element connected in series with second switching elements generates a distortion which may be used for compensating for a signal distortion at the first node. A distortion changeover element is connected in parallel with the distortion generation element and is configured to have a conductance state that is opposite to the conductance state of the first switching elements, such that the changeover element is conducting when the first switching elements are in an non-conductive state and non-conducting when the first switching elements are in a conducting state.

20 Claims, 12 Drawing Sheets

SHUNT SWITCH

CROSS-REFERENCE TO RELATED APPLICATION

This application is based upon and claims the benefit of priority from Japanese Patent Application No. 2013-213713, filed Oct. 11, 2013, the entire contents of which are incorporated herein by reference.

FIELD

Embodiments described herein relate generally to a shunt switch.

BACKGROUND

A shunt switch may include a plurality of field effect transistors (FETs) which are connected in series between a high frequency signal node and a ground node, for example. When the shunt switch is turned on, the high frequency signal node is forcibly made to have the same potential as the ground node.

In such a shunt switch, there is a distortion which is generated when the shunt switch is in an ON state (hereinafter referred to as "ON distortion") and a distortion which is generated when the shunt switch is in an OFF state (hereinafter referred to as "OFF distortion"). It is necessary to make these distortions as small as possible. But, in general, there is a tradeoff relationship between the ON distortion and the OFF distortion. For example, although the number of stages of series connected FETs in the shunt switch can be reduced to lower the ON distortion, the decrease in the number of stages causes an increase the OFF distortion.

DETAILED DESCRIPTION

A shunt switch which decreases an ON distortion without increasing an OFF distortion is described as an example embodiment of the present disclosure.

In general, according to one embodiment, a shunt switch includes a first node to which an alternating current signal is to be applied, a second node to which a reference potential is to be applied, a plurality of first switching elements connected in series between the first and second node, and a plurality of second switching elements connected in series between the first and second node, but not in series with the plurality of first switching element, a distortion generation element connected in series with the plurality of second switching element between the first node and the second node, and a distortion changeover element connected in parallel with the distortion generation element. The distortion generation element is configured to generate a distortion. In some embodiments, the generated distortion may be used to compensate for a signal distortion at the first node. The distortion changeover element is configured to be conducting when the first switching elements are in a non-conducting state (OFF conductive state) and to be non-conducting when the first switching elements are in a conductive state (ON conductive state).

In some embodiments, the second switching elements may be configured to be in an ON conductive state when the first switching elements are in the ON conductive state and in an OFF conductive state when the first switching elements are in the OFF conductive state.

Hereinafter, exemplified embodiments are explained in conjunction with drawings.

First Embodiment

Figure 1:
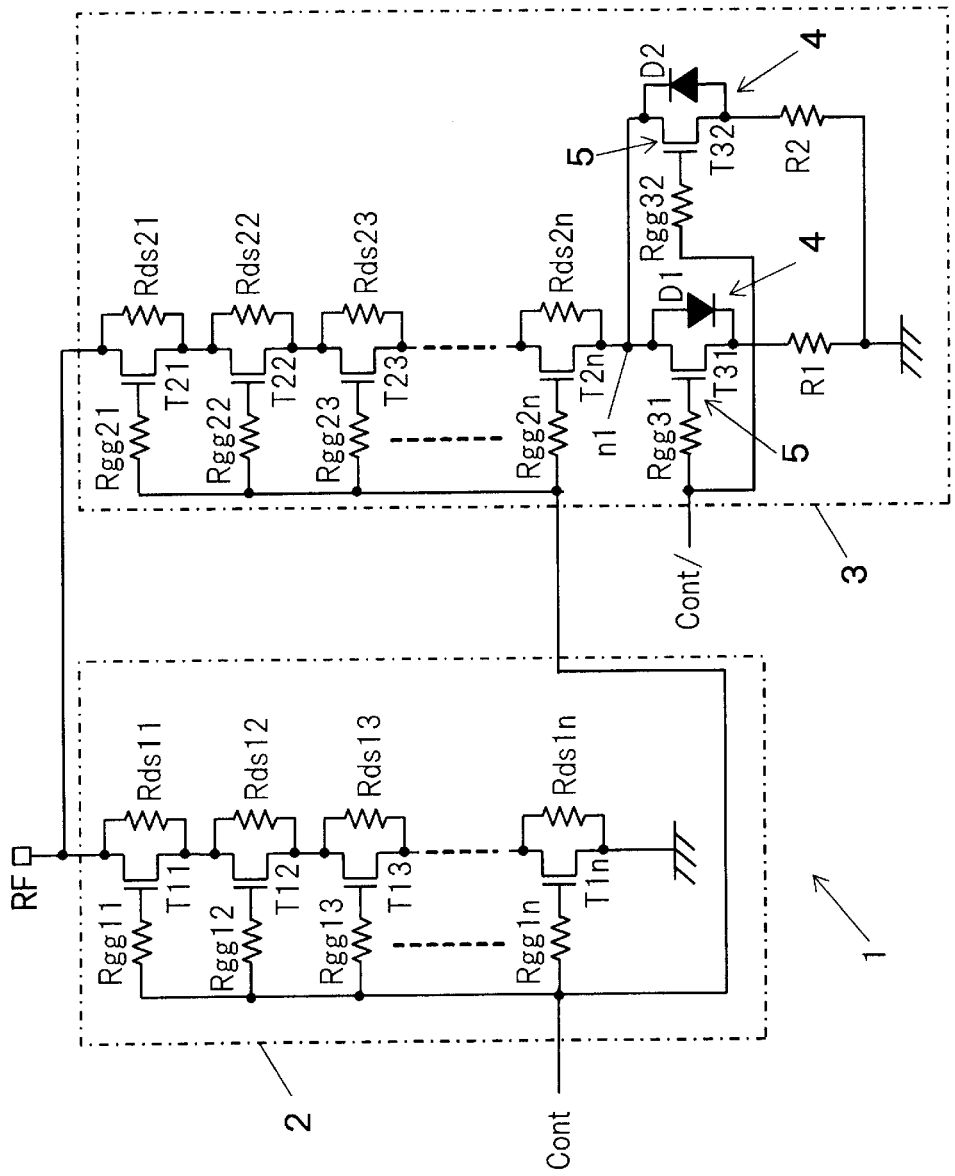
FIG. 1 is a circuit diagram of a shunt switch according to a first embodiment.

FIG. 1 is a circuit diagram of a shunt switch 1 according to the first embodiment. The shunt switch 1 shown in FIG. 1 includes: a switch circuit 2 provided between a high frequency signal node RF (first node) to which a high frequency signal is supplied and a ground node (second node); and a distortion compensation circuit 3 provided between the high frequency signal node RF and the ground node in the same manner as the switch circuit 2.

The switch circuit 2 includes a plurality of first switching elements (T11 to T1n) which are connected in series between the high frequency signal node RF and the ground node, in which the first switching elements T11 to T1n are all changed over to an ON state or an OFF state in response to a control signal.

As used in this disclosure, "connected in series" includes both of the connection where two circuit elements are connected in series with no other circuit elements interposed therebetween and the connection where two circuit elements are connected in series with other circuit elements therebetween.

The distortion compensation circuit 3 is operated so as to decrease a distortion (ON distortion) at the high frequency signal node RF when the switch circuit 2 is in an ON state and is operated so as not to increase a distortion (OFF distortion) at the high frequency signal node RF when the switch circuit 2 is in an OFF state. That is, when the switch circuit 2 is in an OFF state, the state of the shunt circuit 1 is made to be approximately equivalent to a state where the distortion compensation circuit 3 is disconnected from the high frequency signal node RF thus preventing OFF distortion at the high frequency signal node RF from being increased by the influence of the distortion compensation circuit 3. That is, when the switch circuit 2 is in an OFF state, the shunt switch 1 has the distortion characteristic which is substantially equal to the distortion characteristic which the shunt switch 1 would have when the distortion compensation circuit 3 is not connected to the high frequency signal node RF.

The distortion compensation circuit 3 includes a plurality of second switching elements (T21 to T2$n$), a distortion generation circuit 4, and a distortion changeover circuit 5.

The plurality of second switching elements (T21 to T2$n$) are connected in series between the high frequency signal node RF and the ground node, and all of the second switching elements T21 to T2$n$ are changed over to an ON state or an OFF state in response to a control signal to match the state of the plurality of first switching elements (T11 to T1$n$).

The distortion generation circuit 4 is connected in series with the plurality of second switching elements (T21 to T2$n$), and generates a distortion. To be more specific, the distortion generation circuit 4 generates a new distortion for offsetting an ON distortion generated at the switch circuit 2 when both the plurality of first switching elements (T11 to T1$n$) and the plurality of second switching elements (T21 to T2$n$) are in an ON state. That is, when both the plurality of first switching elements and the plurality of second switching elements are in an ON state, the distortion generation circuit 4 serves to improve or decrease the nonlinearity of the current-voltage characteristics of these switching elements.

To be more specific, the distortion generation circuit 4 of this embodiment includes a first diode D1 and a second diode D2. The first diode D1 is connected between a drain and a source of a third switching element T31. The second diode D2 is connected between a drain and a source of a fourth switching element T32. The first diode D1 and the second diode D2 are connected with opposite current flow directions (that is, for example, the anode of the first diode D1 and the cathode of the second diode D2 is connected to an end of second switching element T2$n$). The first diode D1 and the second diode D2 can be formed of a PN junction type diode which is formed on an SOI substrate, for example.

The distortion changeover circuit 5 is connected in parallel to the distortion generation circuit 4. To be more specific, the distortion changeover circuit 5 makes the distortion generation circuit 4 generate a new distortion when the plurality of first switching elements (T11 to T1$n$) and the plurality of second switching elements (T21 to T2$n$) are in an ON state, and makes the distortion generation circuit 4 stop the generation of a new distortion when the plurality of first switching elements and the plurality of second switching elements are in an OFF state.

The distortion changeover circuit 5 includes the third switching element T31 and the fourth switching element T32.

The third switching element T31 is provided between the ground node and one end portion (e.g., the T2$n$ end) of the plurality of second switching elements (T21 to T2$n$) connected in series or between the high frequency signal node RF and the other end portion (e.g., the T21 end) of the plurality of second switching elements (T21 to T2$n$) connected in series. The third switching element T31 is turned on or turned off at timing opposite to timing for turning on or off the plurality of first switching elements (T11 to T1$n$) and the plurality of second switching elements (T21 to T2$n$). Thus, the third switching element T31 is in an ON state (conducting between source-drain) when the first and second switching elements are in an OFF state and in an OFF state when the first and second switching elements are in an ON state.

The fourth switching element T32 is provided between the ground node and one end portion (e.g., the T2$n$ end) of the plurality of second switching elements (T21 to T2$n$) connected in series, or between the high frequency signal node RF and the other end portion (e.g., the T21 end) of the plurality of second switching elements (T21 to T2$n$) connected in series. The fourth switching element T32 is turned on or turned off at timing opposite to timing for turning on or off the plurality of first switching elements (T11 to T1$n$) and the plurality of second switching elements (T21 to T2$n$).

In the embodiment shown FIG. 1, the third switching element T31 and the fourth switching element T32 are connected between an intermediate node (third node) n1 and the ground node respectively. When the first to fourth switching elements are of the same conductive type, a signal "Cont/" obtained by inverting a gate control signal "Cont" supplied to the first and second switching elements, is inputted to gates of the third and fourth switching elements. The intermediate node n1 is a node provided between the high frequency signal node RF and the ground node.

To be more specific, in the embodiment shown in FIG. 1, the third switching element T31 and a first impedance element R1 are connected in series between the intermediate node n1 and the ground node, and the fourth switching element T32 and a second impedance element R2 are connected in series between the intermediate node n1 and the ground node in the same manner. A control signal Cont/ is inputted to the gate of the third switching element T31 through a seventh impedance element Rgg31. A control signal Cont/ is inputted to the gate of the fourth switching element T32 through an eighth impedance element Rgg32.

These first impedance element R1 and second impedance element R2 are provided for adjusting the nonlinearity of the first diode D1 and the second diode D2. The first impedance element R1 may be substituted by a parasitic resistance of the first diode D1. In the same manner, the second impedance element R2 may be substituted by a parasitic resistance of the second diode D2.

The switch circuit 2 includes, in addition to the plurality of first switching elements (T11 to T1$n$): a plurality of third impedance elements Rds11 to Rds1$n$ which are connected between drains and sources of the plurality of respective first switching elements (T11 to T1$n$); and a plurality of fourth impedance elements Rgg11 to Rgg1$n$ which are connected to gates of the plurality of respective first switching elements (T11 to T1$n$).

The distortion compensation circuit 3 includes, in addition to the plurality of second switching elements (T21 to T2$n$), a plurality of fifth impedance elements Rds21 to Rds2$n$ which are connected between drains and sources of the respective second switching elements T21 to T2$n$, and a plurality of sixth impedance elements Rgg21 to Rgg2$n$ which are connected to gates of the respective second switching elements T21 to T2$n$.

The above-mentioned first switching elements (T11 to T1$n$) and the above-mentioned second switching elements (T21 to T2$n$) are formed of n-type MOSFETs mounted on an SOI (Silicon On Insulator) substrate, for example. A threshold voltage of these switching elements is about 0 V. The fourth impedance elements Rgg11 to Rgg1$n$ which are connected to gates of the first and second switching elements (T11 to T1$n$) and the sixth impedance elements Rgg21 to Rgg2$n$, which are connected to gates of the respective second switching elements T21 to T2$n$, have high resistance (100 k$\Omega$ or more, for example) for preventing the leakage of a high frequency signal. When the resistances of the fourth impedance elements (Rgg11 to Rgg1n) and the sixth impedance elements (Rgg21 to Rgg2n) are not set to sufficiently large values, an even-number order distortion is generated. Accordingly, the resistances of the fourth impedance elements Rgg11 to Rgg1n and the sixth impedance elements Rgg21 to Rgg2n are set to large values also from such a viewpoint.

The third impedance elements Rds11 to Rds1n, which are connected between drains and sources of the respective first switching elements T11 to T1n, and the fifth impedance elements Rds21 to Rds2n, which are connected between drains and sources of the respective second switching elements T21 to T2n, are provided for making a voltage equally applied between the sources and the drains of the respective switching elements when the respective switching elements are in an OFF state. The third impedance elements Rds11 to Rds1n and the fifth impedance elements Rds21 to Rds2n have high resistances (10kΩ or more, for example).

It is desirable that the third impedance elements (Rds11 to Rds1n) in the switch circuit 2 have the same impedance (resistance value) as each other, and it is also desirable that the fourth impedance elements (Rgg11 to Rgg1n) also have the same impedance as each other. In the same manner, it is desirable that the fifth impedance elements (Rds21 to Rds2n) in the distortion compensation circuit 3 have the same impedance as each other, and it is also desirable that the sixth impedance elements (Rgg21 to Rgg2n) have the same impedance as each other.

As described more fully later, it is desirable to set a size or a dimension of the switch circuit 2 to be larger than a dimension of the distortion compensation circuit 3. The impedance of each fifth impedance element (Rds21 to Rds2n) and the impedance of each sixth impedance element (Rgg21 to Rgg2n) should be adjusted in accordance with such setting of the dimension of the switch circuit 2. That is, it is desirable to set the impedance of the fifth impedance elements (Rds21 to Rds2n) to be larger than the impedances of the third impedance elements (Rds11 to Rds1n). It is also desirable to set the impedance of each sixth impedance element (Rgg21 to Rgg2n) to be larger than the impedance of each fourth impedance element (Rgg11 to Rgg1n).

That is, it is typically desirable to set the size or the dimension of the switch circuit 2 to be larger than the dimension of the distortion compensation circuit 3. In this embodiment, the "dimension" means a gate width of the switching elements. For example, a gate width of the first switching elements T11 to T1n can be greater than a gate width of the second switching elements T21 to T2n. The larger the dimension, the larger an OFF capacity when the switching element is in an OFF state becomes—that is, a larger gate width generally provides a better resistance to breakdown at higher voltages. Accordingly, by setting the dimension of the distortion compensation circuit 3 to be smaller than the dimension of the switch circuit 2, the OFF capacity of the distortion compensation circuit 3 may be further decreased. For example, while the gate width of the second to fourth switching elements (T21 to T2n, T31, and T41) in the distortion compensation circuit 3 is set to 30 µm, the gate width of the first switching elements (T11 to T1n) in the switch circuit 2 is set to 9 mm.

The first and second switching elements (T11 to T1n and T21 to T2n, respectively) are turned on when a control signal Cont is at a high level (3 V, for example), and the resistance between the high frequency signal node RF and the ground node becomes a resistance Ron1 which is the sum of ON resistances of the first switching elements (T11 to T1n). The resistance Ron1 is only several ohms (Ω) so that the high frequency signal node RF is brought into a state where the high frequency signal node RF is essentially short-circuited to the ground node.

On the other hand, when a control signal Cont is at a low level (−2 V, for example), the all of the first and second switching elements are turned off so that the high frequency signal node RF and the ground node are brought into a substantially open state (electrically disconnected from each other). When a characteristic impedance of a transmission path through which passes through the high frequency signal node RF is 50Ω, a power signal of about 35 dBm (decibels relative to 1 milliwatt of power) is applied to the high frequency signal node RF at maximum. Accordingly, the plurality of first switching elements (T11 to T1n) are connected in series between the high frequency signal node RF and the ground node so as to suppress a voltage applied to each one of the first switching elements T11 to T1n in respective stages. While the number of stages n of the first switching elements T11 to T1n which are connected in series changes depending on the magnitude of the power signal applied to the high frequency signal node RF, the number of stages n of the first switching elements T11 to T1n may be set to 36 (n=36), for example. Even when the number of stages n is increased, to suppress the resistance Ron1 between the high frequency signal node RF and the ground node to about 3Ω or less, it is necessary to increase the gate width of the first switching elements (T11 to T1n) to about 9 mm, for example.

The control signals Cont, Cont/ shown in FIG. 1 are supplied from a control circuit not specifically depicted in the drawing. The control circuit adjusts the control signals Cont, Cont/ based on an output signal supplied by a circuit that detects a characteristic of the whole high frequency circuit where the shunt switch 1 of this embodiment is provided as an element, for example.

The plurality of second switching elements (T21 to T2n), the plurality of fifth impedance elements (Rds21 to Rds2n) and the plurality of sixth impedance elements (Rgg21 to Rgg2n) in the distortion compensation circuit 3 are constituted in a similar manner as the switching elements and the impedance elements in the switch circuit 2. Although the number of stages n of the second switching elements T21 to T2n connected in series is set equal to the number of stages n of the first switching elements T11 to T1n in the switch circuit 2, for example, the number of stages of the second switching elements T21 to T2n may be different from the number of stages of the first switching elements T11 to T1n. That is, the total number of first switching elements (T11 to T1n) does not have to be equal to the total number of second switching elements (T21 to T2n).

Figure 2:
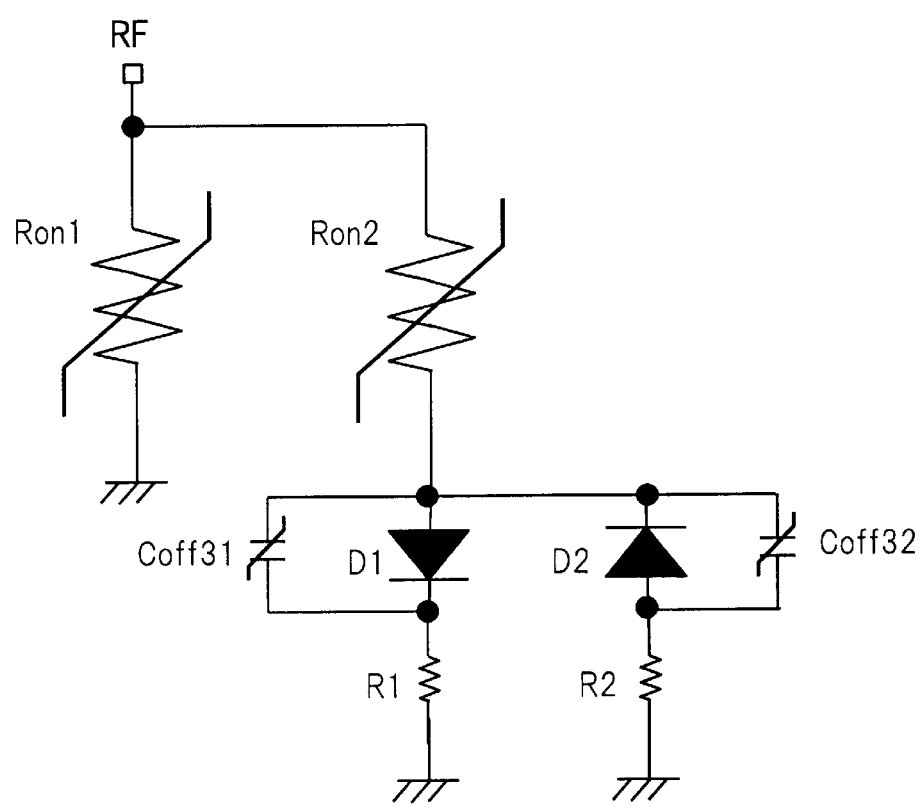
FIG. 2 is an equivalent circuit diagram of the shunt switch when a switch circuit is in an ON state.

FIG. 2 is an equivalent circuit diagram of the shunt switch 1 when the switch circuit 2 is in an ON state. When the switch circuit 2 is in an ON state, the plurality of first switching elements (T11 to T1n) and the plurality of second switching elements (T21 to T2n) are equivalently expressed as nonlinear resistances Ron1 and Ron2, respectively. A linear resistance component of the nonlinear resistance Ron1 is 2.5Ω, for example, and a linear resistance component of the nonlinear resistance Ron2 is 740Ω, for example. The third switching element T31 and the fourth switching element T32 in the distortion compensation circuit 3 are expressed as nonlinear OFF capacitances Coff31 and Coff32, respectively.

As can be understood from the circuit shown in FIG. 2, when the switch circuit 2 is in an ON state, a high frequency distortion is generated at the high frequency signal node RF due to the nonlinearity of the nonlinear resistance Ron1. When the nonlinear resistance Ron1 is formed of only a two-terminal circuit, only an odd-number order distortion is generated. In this example, a third-order harmonic wave which is the lowest odd-number order harmonic wave is considered.

The nonlinear resistance Ron1 is generated based on the voltage-current characteristics of the plurality of first switching elements (T11 to T1n) in the switch circuit 2, and the larger the voltage applied to the high frequency signal node RF, the larger the nonlinear resistance Ron1 becomes.

But in the first embodiment, the first diode D1 and the second diode D2 are connected to the intermediate node n1 with opposite current flow directions and hence, the larger the voltage that is applied to the high frequency signal node RF, the smaller the differential resistances of the first diode D1 and the second diode D2 become.

Figure 3A:
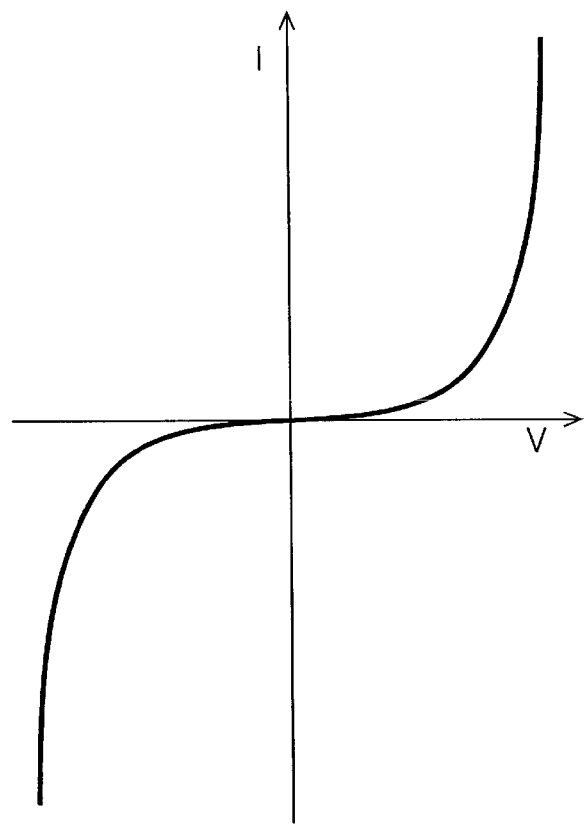
FIG. 3A is a graph showing a voltage-current characteristic when two diodes are connected in parallel to each other with opposite current flow directions.
Figure 3B:
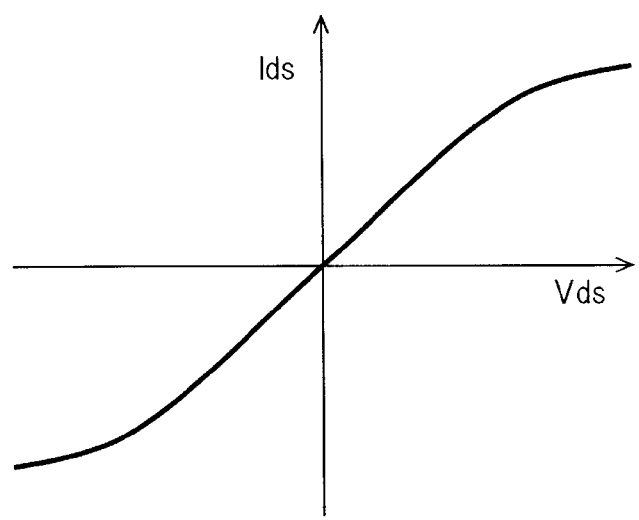
FIG. 3B is a graph showing a V-I characteristic of first switching elements and second switching elements.

FIG. 3A is a graph showing a voltage-current characteristic when two diodes are connected in parallel to each other with opposite current flow directions, in which a voltage at both ends of these diodes is taken on an axis of abscissas (X-axis), and an electric current which flows in these diodes is taken on an axis of ordinates (Y-axis). FIG. 3B is a graph showing a V-I characteristic of the first switching elements T11 to T1n and the second switching elements T21 to T2n, in which a drain-source voltage is taken on an axis of abscissas (X-axis), and a drain-source current is taken on an axis of ordinates (Y-axis).

As shown in FIG. 3B, with respect to the first switching elements T11 to T1n and the second switching elements T21 to T2n, the larger a drain-source voltage Vds, the more the rise of a drain-source current Ids is suppressed so that the first switching elements T11 to T1n and the second switching elements T21 to T2n have a nonlinear characteristic. The nonlinear characteristic is expressed by the following formula (1).

$$Ids = kVds - dVds^3 + \ldots \quad (1)$$

A second term on a right side of the formula (1) is a third-order distortion component, and is a main factor which makes a graph shown in FIG. 3B nonlinear. Two diodes D1, D2 connected in parallel to each other with opposite current flow directions have a function of offsetting the third-order distortion component in the formula (1). In an actual operation, constants of respective circuit elements in the distortion compensation circuit 3 are adjusted until the constants at which the third-order distortion component in the formula (1) is minimized are selected. For example, the third-order distortion component can be minimized by adjusting the sizes of the first diode D1 and the second diode D2 and the impedances of the first impedance element R1 and second impedance element R2.

When the switch circuit 2 is in an ON state, the third switching element T31 and the fourth switching element T32 are in an OFF state, and voltages substantially equal to forward voltages of the first diode D1 and the second diode D2 are applied to both ends of the nonlinear off capacitances Coff31, Coff32, respectively. Accordingly, distortion generated by the nonlinear off capacitances Coff31, Coff32 can be ignored.

Figure 4:
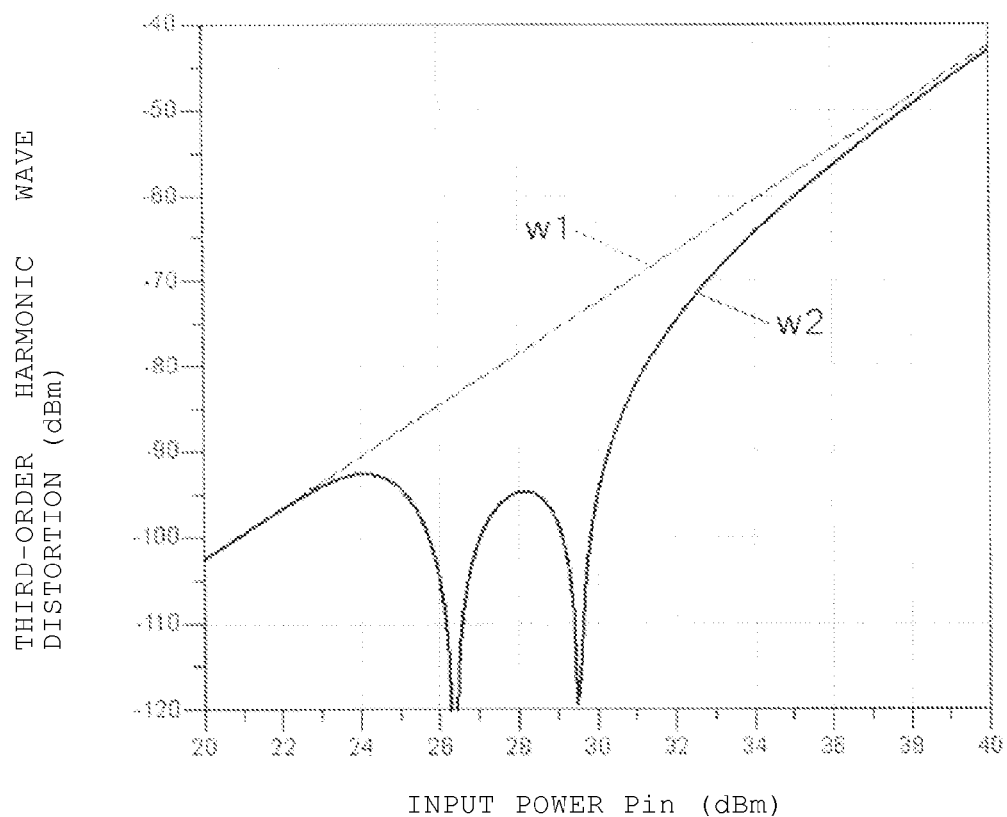
FIG. 4 is a graph showing a simulation result of a third-order harmonic wave distortion characteristic of the shunt switch shown in FIG. 1 and a third-order harmonic wave distortion characteristic of a shunt switch according to one comparison example which includes only a switch circuit.

FIG. 4 is a graph showing a simulation result of a third-order harmonic wave distortion characteristic of the shunt switch 1 shown in FIG. 1 and a third-order harmonic wave distortion characteristic of a shunt switch according to one comparison example which includes only the switch circuit 2. This graph shows the case where a frequency of a high frequency signal applied to the high frequency signal node RF is 915 MHz. A straight line w1 in FIG. 4 corresponds to the shunt switch according to the comparison example, and a line w2 in FIG. 4 corresponds to the shunt switch 1 shown in FIG. 1.

As shown in FIG. 4, assuming that an allowable value of a third-order harmonic wave is −90 dBm, the maximum allowable input power according to the comparison example is 24.1 dBm (the level at which line w1 crosses −90 dBm), while the maximum allowable input power according to this embodiment is 30.3 dBm (the level at which line w2 crosses −90 dBm). Accordingly, it is expected that the maximum allowable input power according to this embodiment is enhanced by about 6 dB.

Circuit constants used in the simulation shown in FIG. 4 are described. An ON resistance per unit gate width of respective FETs which constitute the plurality of first switching elements (T11 to T1n) and the plurality of second switching elements (T21 to T2n) is 0.616 Ω·mm, a gate width of the respective FETs corresponding to the plurality of first switching elements (T11 to T1n) is 9 mm, the number of stages n in the plurality of first switching elements (T11 to T1n) and the number of stages n in the plurality of second switching elements (T21 to T2n) are 36 (n=36), a gate width of the respective FETs corresponding to the plurality of second switching elements (T21 to T2n) is 30 μm, a resistance value of the first impedance element R1 and a resistance value of the second impedance element R2 are 2.7 kΩ, and a reverse current IS of the first diode D1 and the second diode D2 is $10^{-13}$ A (IS= $10^{-13}$ A).

Figure 5:
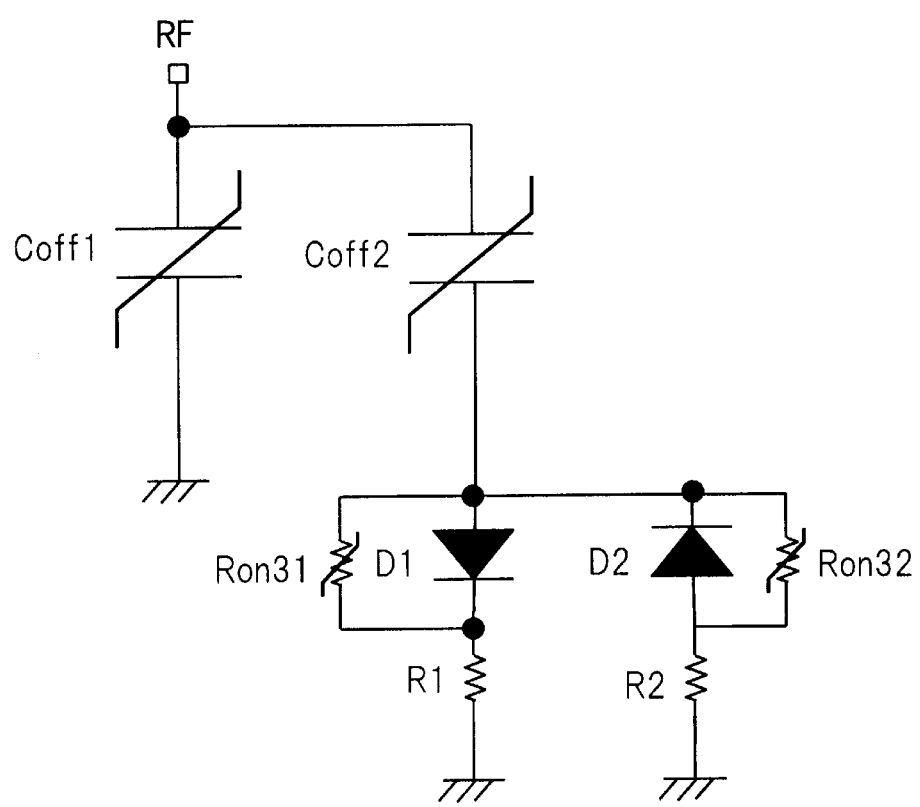
FIG. 5 is an equivalent circuit diagram of the shunt switch when the switch circuit is in an OFF state.

FIG. 5 is an equivalent circuit diagram of the shunt switch 1 when the switch circuit 2 is in an OFF state. When the switch circuit 2 is in an OFF state, the plurality of first switching elements (T11 to T1n) and the plurality of second switching elements (T21 to T2n) can be equivalently expressed by nonlinear off capacitances Coff1, Coff2, respectively.

As described above, in this embodiment, the dimension of the distortion compensation circuit 3 is set smaller than the dimension of the switch circuit 2 and hence, a linear component of the nonlinear off capacitance Coff2 is extremely small, that is, about 0.33% of the linear component of the nonlinear off capacitance Coff1 so that an OFF distortion generated at the plurality of second switching elements (T21 to T2n) can be ignored.

Although the first diode D1 and the second diode D2 may become a new source for generating a distortion, when the switch circuit 2 is in an ON state, the third switching element T31 and the fourth switching element T32 are brought into an ON state so that the third switching element T31 can be equivalently replaced with an ON resistance Ron31 and, in the same manner, the fourth switching element T32 can be equivalently replaced with an ON resistance Ron32. Accordingly, an electric current from the intermediate node n1 flows through the ON resistances Ron31, Ron32 and hence, an OFF distortion of the first diode D1 and the second diode D2 can be ignored.

In this manner, in the first embodiment, the shunt switch 1 includes the distortion compensation circuit 3 in addition to the switch circuit 2, and the plurality of second switching elements (T21 to T2n) which are turned on or off in synchronism with the switch circuit 2, the distortion generation circuit 4 and the distortion changeover circuit 5 are provided in the distortion compensation circuit 3. When the switch circuit 2 is turned on, the plurality of second switching elements (T21 to T2n) are also turned on, and the distortion generation circuit 4 operates the first diode D1 and the second diode D2 such that an ON distortion at the high frequency signal node RF is decreased. Due to such an operation, an ON distortion at the high frequency signal node RF can be decreased.

The dimension of the distortion compensation circuit 3 is set smaller than the dimension of the switch circuit 2 and hence, when the switch circuit 2 is in an OFF state, an OFF capacity of the distortion compensation circuit 3 becomes smaller than an OFF capacity of the switch circuit 2 so that an OFF distortion at the high frequency signal node RF hardly changes irrespective of the presence or the absence of the distortion compensation circuit 3.

Due to such a constitution, according to the first embodiment, it is possible to decrease an ON distortion without increasing an OFF distortion. Thus, it is possible to decrease a third-order harmonic wave distortion at the high frequency signal node RF when the switch circuit 2 is in an ON state.

Second Embodiment

The second embodiment explained hereinafter is characterized in that some circuit components are used in common by a switch circuit 2 and a distortion compensation circuit 3. That is, some components are shared between the switch circuit 2 and the distortion compensations circuit 3.

Figure 6:
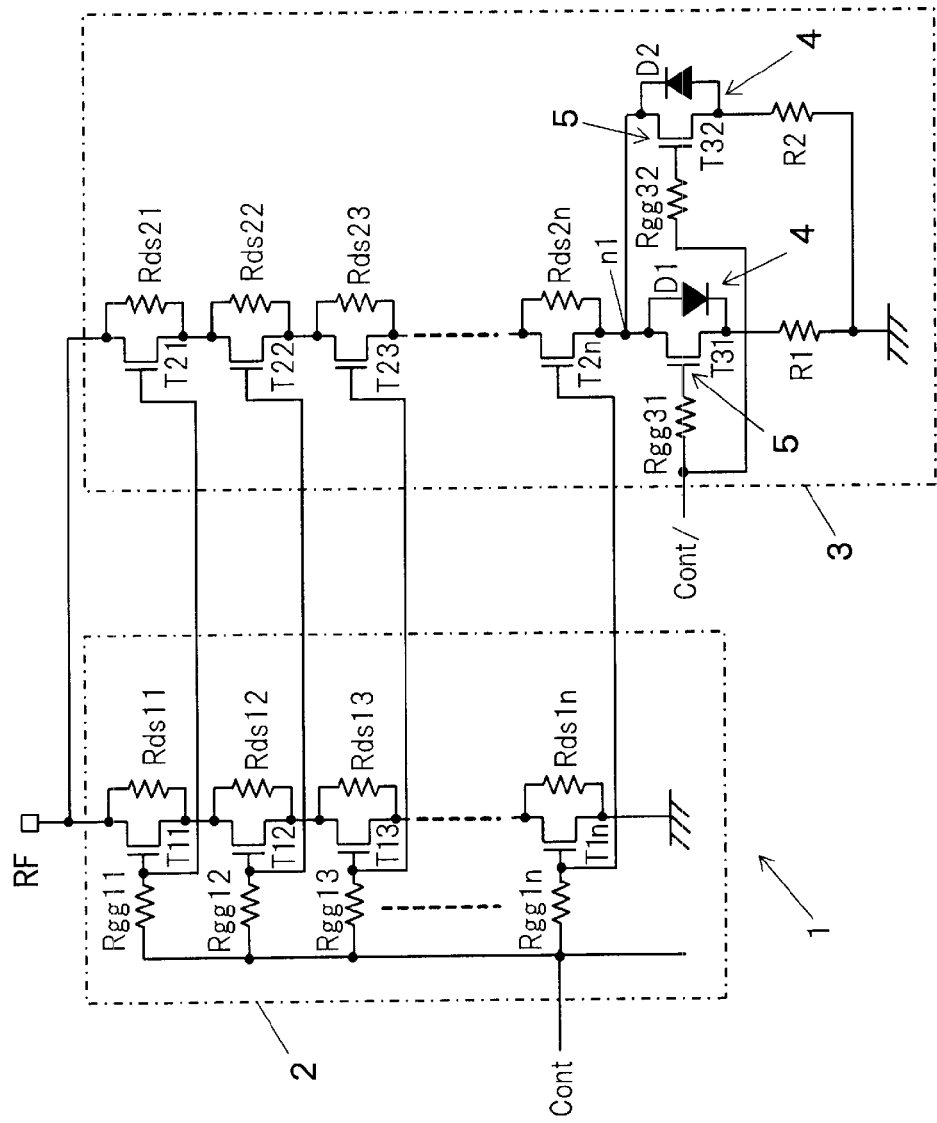
FIG. 6 is a circuit diagram of a shunt switch according to a second embodiment.

FIG. 6 is a circuit diagram of a shunt switch 1 according to the second embodiment. In the shunt switch 1 shown in FIG. 6, respective gates of a plurality of first switching elements (T11 to T1n) in the switch circuit 2 and respective gates of corresponding second switching elements (T21 to T2n) in the distortion compensation circuit 3 are connected to each other. Due to such a arrangement, the plurality of sixth impedance elements (Rgg21 to Rgg2n) which are connected to the gates of the plurality of respective second switching elements (T21 to T2n) shown in FIG. 1 become unnecessary.

Accordingly, due to the shunt switch 1 shown in FIG. 6, it is possible to decrease a circuit area, as compared to the shunt switch 1 shown in FIG. 1. Further, the shunt switch 1 shown in FIG. 6 can also decrease an ON distortion without increasing an OFF distortion.

Third Embodiment

The third embodiment explained hereinafter differs from the first embodiment with respect to the internal constitution of a distortion generation circuit 4 and a distortion changeover circuit 5 in distortion compensation circuit 3.

Figure 7:
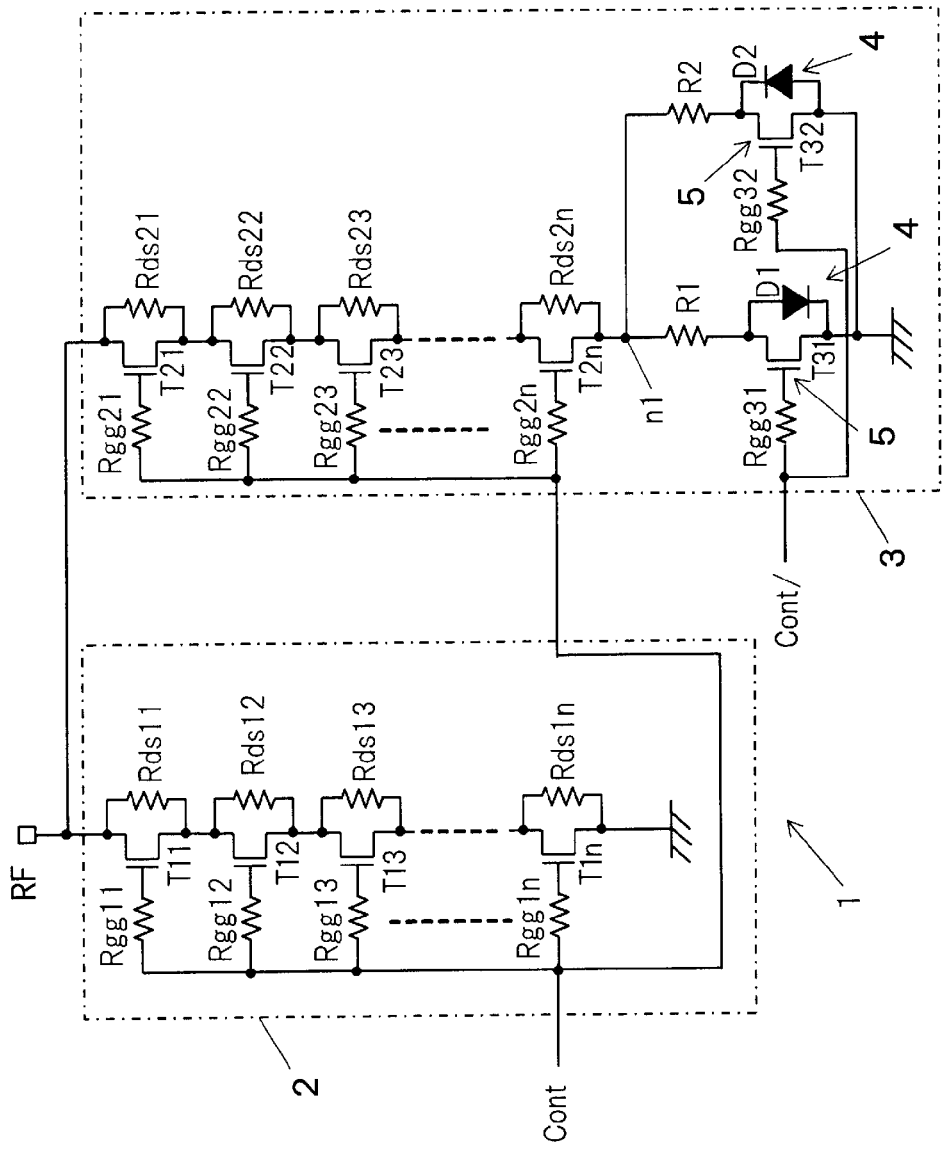
FIG. 7 is a circuit diagram of a shunt switch according to a third embodiment.

FIG. 7 is a circuit diagram of a shunt switch 1 according to the third embodiment. The shunt switch 1 shown in FIG. 7 includes a distortion generation circuit 4 and a distortion changeover circuit 5 that differ from that of the distortion generation circuit 4 and the distortion changeover circuit 5 of the shunt switch 1 shown in FIG. 1. To be more specific, a connection order of a first impedance element R1 and a third switching element T31 and a connection order of a second impedance element R2 and a fourth switching element T32 are opposite to the connection order of these elements shown in FIG. 1. That is, one end of the first impedance element R1 and one end of the second impedance element R2 are connected to an intermediate node n1, a source of the third switching element T31 and a source of the fourth switching element T32 are connected to a ground node, and a cathode of a first diode D1 and a cathode of a second diode D2 are connected to the ground node.

The shunt switch 1 of this embodiment does not differ from the shunt switches 1 of the first and second embodiments in terms of the circuit operation. Accordingly, in to the third embodiment, it is possible to decrease an ON distortion without increasing an OFF distortion in the same manner as the shunt switches 1 of the first and second embodiments.

Fourth Embodiment

The fourth embodiment explained hereinafter differs from the first embodiment with respect to the connection order of a plurality of second switching elements (T21 to T2n), a distortion generation circuit 4 and a distortion changeover circuit 5 in a distortion compensation circuit 3.

Figure 8:
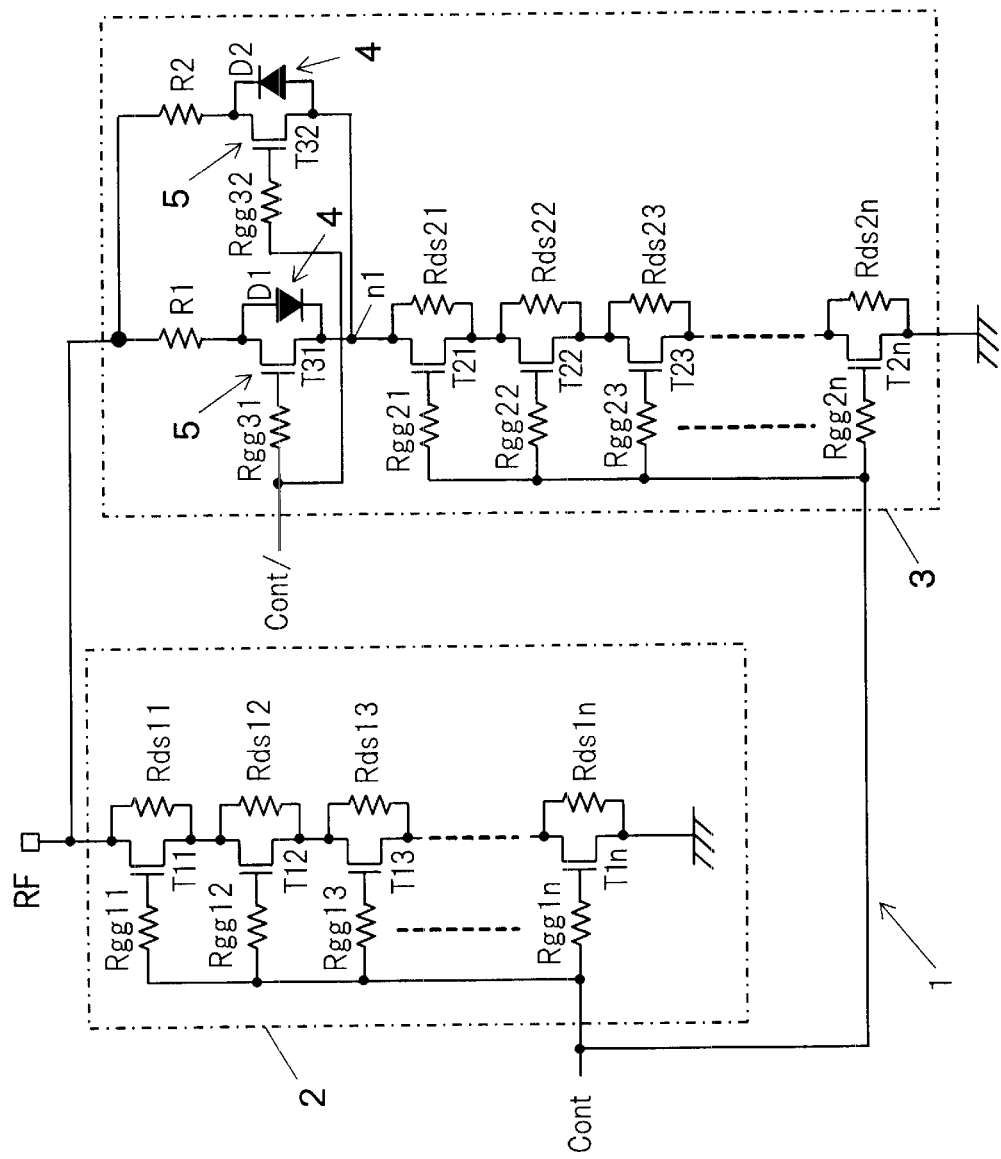
FIG. 8 is a circuit diagram of a shunt switch according to a fourth embodiment.

FIG. 8 is a circuit diagram of a shunt switch 1 according to the fourth embodiment. In the shunt switch 1 shown in FIG. 8, the distortion generation circuit 4 and the distortion changeover circuit 5 are connected between a high frequency signal node RF and an intermediate node n1, and the plurality of second switching elements (T21 to T2n) are connected between the intermediate node n1 and a ground node.

The shunt switch 1 of this embodiment does not differ from the shunt switches 1 of the first to third embodiments in terms of the circuit operation. Accordingly, in the fourth embodiment, it is possible to decrease an ON distortion without increasing an OFF distortion in the same manner as the shunt switches 1 of the first to third embodiments.

Fifth Embodiment

The fifth embodiment explained hereinafter differs from the first embodiment with respect to the internal constitution of a distortion generation circuit 4 and a distortion changeover circuit 5 in a distortion compensation circuit 3.

Figure 9:
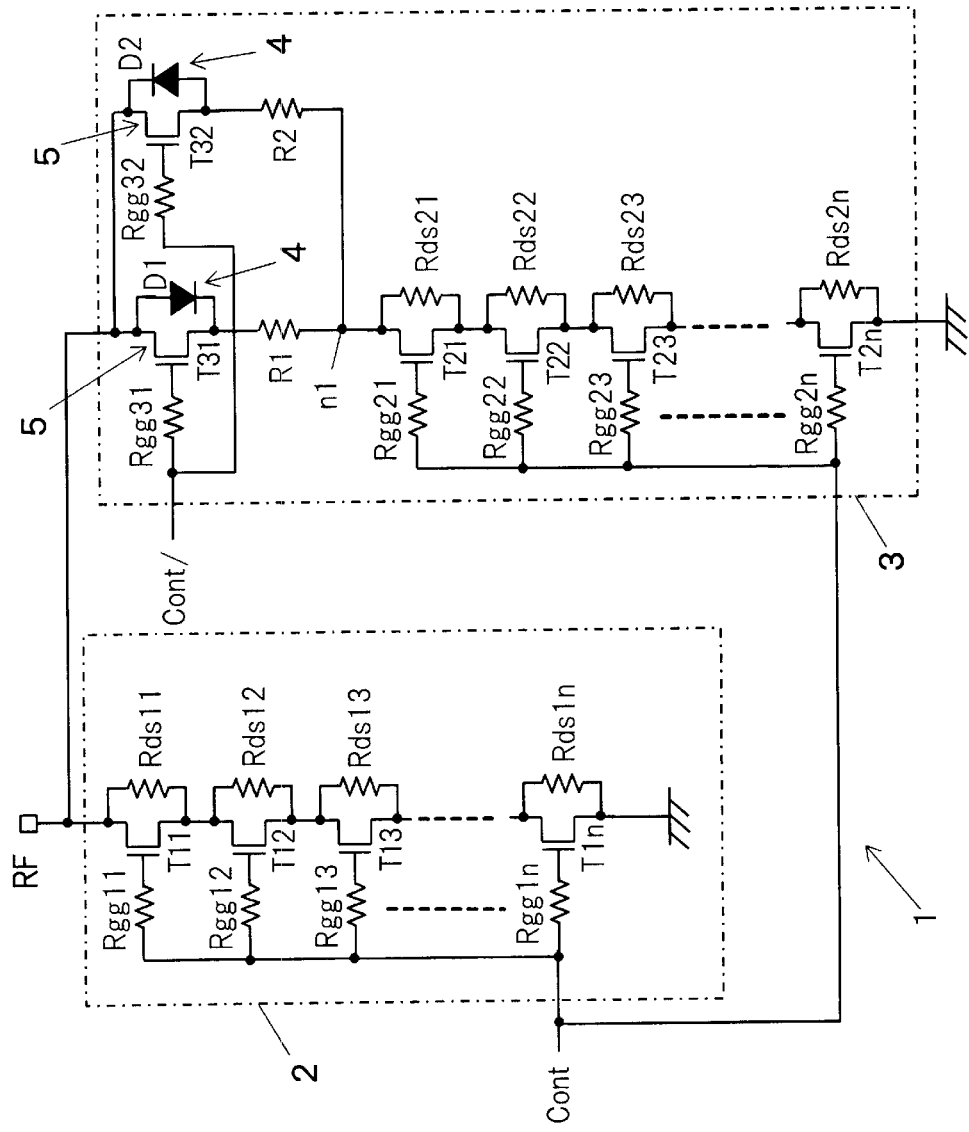
FIG. 9 is a circuit diagram of a shunt switch according to a fifth embodiment.

FIG. 9 is a circuit diagram of a shunt switch 1 according to the fifth embodiment. The shunt switch 1 shown in FIG. 9 includes the distortion generation circuit 4 and the distortion changeover circuit 5 that differ from the distortion generation circuit 4 and the distortion changeover circuit 5 of the shunt switch 1 shown in FIG. 8. To be more specific, the connection order of a first impedance element R1 and a third switching element T31 and the connection order of a second impedance element R2 and a fourth switching element T32 are opposite to the corresponding connection orders of these elements shown in FIG. 8.

The shunt switch 1 of this fifth embodiment does not differ from the shunt switch 1 of the fourth embodiment in terms of the circuit operation. Accordingly, in the fifth embodiment, it is possible to decrease an ON distortion without increasing an OFF distortion in the same manner as the shunt switch 1 of the fourth embodiment.

Sixth Embodiment

In the sixth embodiment explained hereinafter, parasitic diodes formed by third and fourth switching elements T31, T32 are used as first and second diodes D1, D2.

Figure 10A:
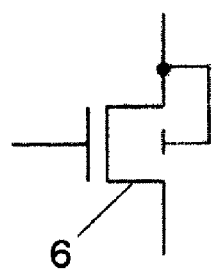
FIG. 10A is a diagram showing a MOSFET where a body is connected to a drain.
Figure 10B:
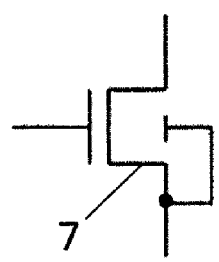
FIG. 10B is a diagram showing a MOSFET where a body is connected to a source.

FIG. 10A is a diagram showing a MOSFET 6 of which a body is connected to a drain, and FIG. 10B is a diagram showing a MOSFET 7 of which a body is connected to a source.

In the MOSFET 6 shown in FIG. 10A, a parasitic diode formed between a source and the body may be used as the first diode D1 shown in FIG. 1 (or other embodiments). In the MOSFET 7 shown in FIG. 10B, a parasitic diode formed between a drain and the body may be used as the second diode D2 shown in FIG. 1 (or other embodiments).

Figure 11:
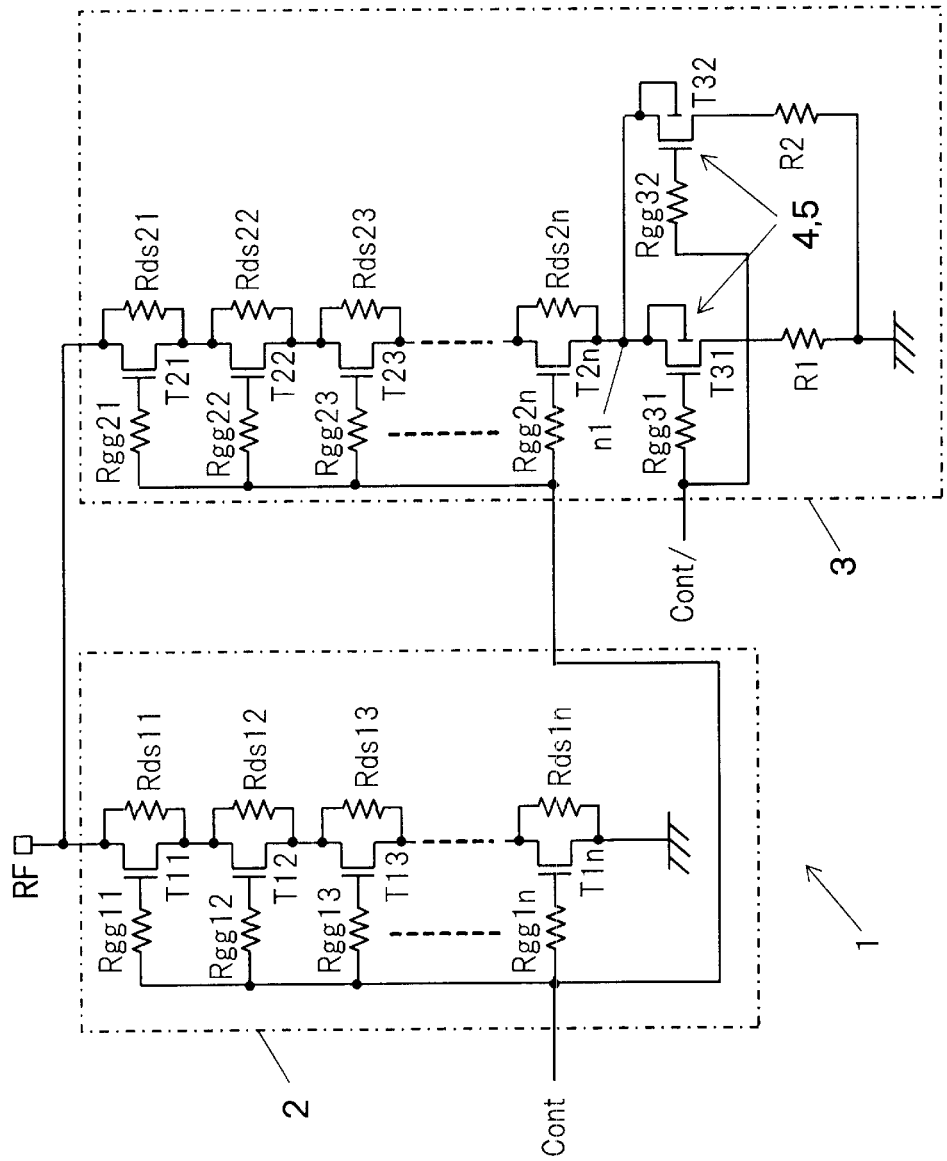
FIG. 11 is a circuit diagram of a shunt switch according to a sixth embodiment.

FIG. 11 is a circuit diagram of a shunt switch 1 according to the sixth embodiment. In the shunt switch 1 shown in FIG. 11, the third switching element T31 is formed of the MOSFET 6 shown in FIG. 10A, and the fourth switching element T32 is formed of the MOSFET 7 shown in FIG. 10B. Accordingly, the first diode D1 and the second diode D2 are not necessary.

In this manner, in the sixth embodiment, the MOSFET 6 where the body is connected to the drain and the MOSFET 7 of which body is connected to the source are provided in a distortion generation circuit 4. Accordingly, it is unnecessary to separately provide the first diode D1 and the second diode D2 as the function of these elements is provided by the third switching element T31 and the fourth switching element T32 connected as depicted in FIG. 10A and FIG. 10B. Hence, the distortion compensation circuit 3 can be simplified.

Seventh Embodiment

The seventh embodiment explained hereinafter is characterized in that a body of a MOSFET used in the first and second switching elements (respectively, T11 to T1n and T21 to T2n) is not brought into a floating state, but is set at a specific potential.

Figure 12:
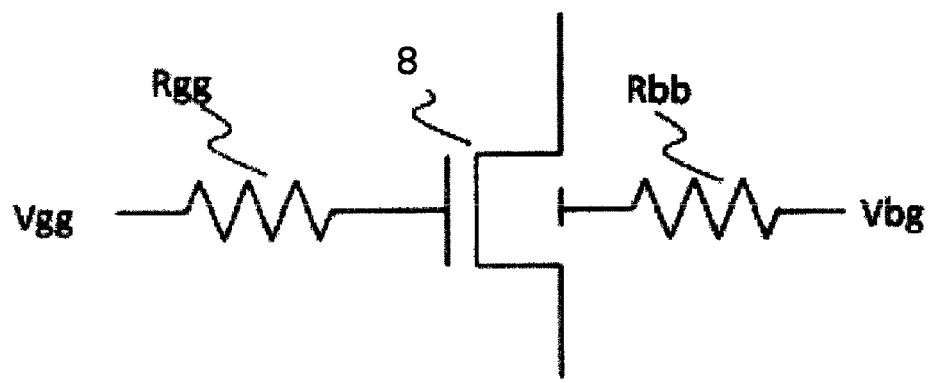
FIG. 12 is a diagram showing one example of a MOSFET which may be used in first and second switching elements.

FIG. 12 is a block diagram showing one example of a MOSFET 8 used in the first and second switching elements (respectively, T11 to T1n, T21 to T2n). A gate voltage Vgg is applied to a gate of the MOSFET 8 shown in FIG. 12 through impedance element Rgg), and a body voltage Vbg is applied to a body through a seventh impedance element Rbb.

When the gate voltage Vgg is a positive voltage, a voltage of 0 V or below is applied as the body voltage Vbg. When the gate voltage Vgg is a negative voltage, a voltage equal to or substantially equal to the gate voltage Vgg is applied as the body voltage Vbg. Due to such an operation, a leak current from the MOSFET 8 when the MOSFET 8 is in an OFF state is decreased. Accordingly, the required number of the first and second switching elements may be decreased.

Figure 13:
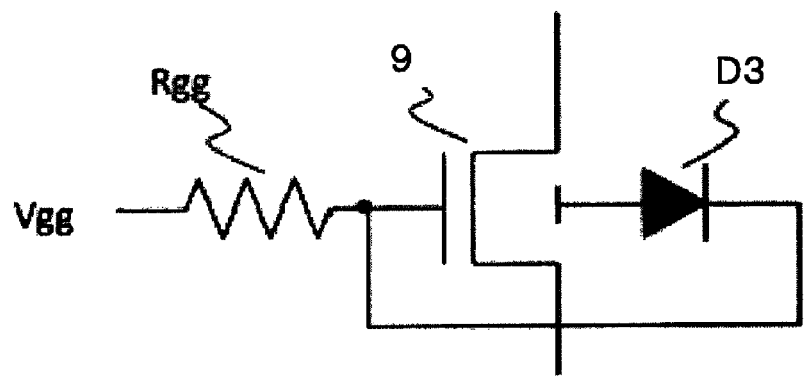
FIG. 13 is a diagram showing a MOSFET which is a possible modification of the MOSFET which may be used in the first and second switching elements.

FIG. 13 is a block diagram showing a MOSFET 9 which constitutes a modification of the MOSFET 8 shown in FIG. 12. In the MOSFET 9, as shown in FIG. 13, a diode D3 is provided in place of the seventh impedance element Rbb shown in FIG. 12, an anode of the diode D3 is connected to a body of the MOSFET 9, and a cathode of the diode D3 is connected to a gate of the MOSFET 9. In the MOSFET 9, when a gate voltage Vgg is a positive voltage, the diode D3 is brought into a reverse bias state so that the body is brought into a state close to a floating state. On the other hand, when the gate voltage Vgg is a negative potential, the body assumes a voltage close to the gate voltage Vgg. Accordingly, also in the MOSFET 9, a leak current in an OFF state can be suppressed so that the required number of the first and second switching elements may be decreased.

In this manner, in the seventh embodiment, the body of the MOSFET used in the first and second switching elements is not simply floating, and a leak current when the MOSFET is in an OFF state may be suppressed, which allows for a reduction in the number of the first and second switching elements used in the shunt switch.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A shunt switch, comprising:
   a plurality of first switching elements connected in series between a first node to which an alternating current signal is to be applied and a second node to which a reference potential is to be applied;
   a plurality of second switching elements connected in series between the first and second node, but not in series with the plurality of first switching elements;
   a distortion generation element connected in series with the plurality of second switching elements between the first node and the second node, the distortion generation element configured to generate a distortion; and
   a distortion changeover element connected in parallel with the distortion generation element and configured to be conducting when the first switching elements are in a non-conductive state and to be non-conducting when the first switching elements are in a conductive state.

2. The shunt switch of claim 1, wherein
   a first control signal is supplied to the plurality of first switching elements for switching a conductive state of the first switching elements, and
   a second control signal is supplied to the distortion changeover element for switching a conductive state of the distortion changeover element.

3. The shunt switch of claim 2, wherein the first control signal is also supplied to the plurality of second switching elements for switching a conductive state of the second switching elements.

4. The shunt switch of claim 1, wherein the distortion generated by the distortion generation element compensates for a signal distortion at the first node.

5. The shunt switch of claim 1, wherein the distortion generating element is connected between the first node and the plurality of second switching elements.

6. The shunt switch of claim 1, wherein the distortion generating element comprises first and second diodes that are connected such that an anode of the first diode is connected to a cathode of the second diode.

7. The shunt switch of claim 6, wherein at least one of the first and second diodes is a parasitic diode comprising a metal-oxide-semiconductor field effect transistor (MOSFET) having a one of a source terminal and a drain terminal connected to a body terminal of the MOSFET.

8. The shunt switch of claim 6, further comprising:
   a first impedance element connected in series with the first diode; and
   a second impedance element connected in series with the second diode.

9. The shunt switch of claim 1, wherein
   the distortion changeover element includes:
      a third switching element between the second node and the plurality of second switching elements; and
      a fourth switching element between the second node and the plurality of second switching elements, the third and fourth switching elements configured to be in the conducting state when the first switching elements are in the non-conducting state, and in the non-conducting state when the first switching elements are in the conducting state; and
   the distortion generation element includes:
      a first diode connected between a drain terminal and a source terminal of the third switching element; and
      a second diode connected between a drain terminal and a source terminal of the fourth switching element, the first diode and the second diode connected such that an anode of one of the first and second diodes is connected to a cathode of the other one of the first and second diodes.

10. The shunt switch of claim 1, wherein
    the distortion changeover element includes:
       a third switching element between the first node and the plurality of second switching elements; and a fourth switching element between the first node and the plurality of second switching elements, the third and fourth switching elements configured to be in the conducting state when the first switching elements are in the OFF conductance state, and in the non-conducting state when the first switching elements are in the conducting state; and the distortion generation element includes:
a first diode connected between a drain terminal and a source terminal of the third switching element; and
a second diode connected between a drain terminal and a source terminal of the fourth switching element, the first diode and the second diode connected such that an anode of one of the first and second diodes is connected to a cathode of the other one of the first and second diodes.

11. The shunt switch of claim 1, wherein the distortion changeover element comprises:
a third switching element between a one of the first and second node and the plurality of second switching elements; and
a fourth switching element between the one of the first and second node and the plurality of second switching elements, the third and fourth switching elements configured to be in the conducting state when the first switching elements are in the non-conducting state, and in the non-conducting state when the first switching elements are in the conducting state,
the third switching element is a metal-oxide-semiconductor field effect transistor (MOSFET) having a drain terminal connected to a body terminal of said MOSFET,
the fourth switching element is a metal-oxide-semiconductor transistor (MOSFET) having a source terminal connected to a body terminal of said MOSFET, and
the distortion generation circuit is comprised by the third and fourth switching elements.

12. A RF signal switch, comprising:
a first node to which an alternating current signal is to be applied;
a second node to which a reference potential is to be applied;
a plurality of first switching elements connected in series between the first and second node;
a plurality of second switching elements connected in series between the first and second node, but not in series with the plurality of first switching element, the second switching elements configured to be in a conductive state when the first switching elements are in the conductive state and in a non-conductive state when the first switching elements are in the non-conductive state;
a third switching element connected in series with the plurality of second switching elements between the first and second nodes, the third switching element configured to be in a conduction state that is an opposite of the first switching elements;
a fourth switching element connected in series with the plurality of second switching elements between the first and second nodes and in parallel with the third switching element, the fourth switching element configured to be in the conduction state that is the opposite of the first switching elements;
a first diode connected in series with the plurality of second switching elements between the first and second nodes and in parallel with the third switching element; and
a second diode connected in series with the plurality of second switching elements between the first and second nodes and in parallel with the fourth switching element, the second diode reverse connected with respect to a connection direction of the first diode.

13. The RF signal switch of claim 12, further comprising:
a first impedance element connected in series with each of the third switching element and the first diode between the first and second nodes; and
a second impedance element connected in series with each of the fourth switching element and the second diode between the first and second nodes.

14. The RF signal switch of claim 13, wherein
the third and fourth switching elements are between the plurality of second switching elements and the second node,
the first impedance element is between the third switching element and the plurality of second switching elements, and
the second impedance element is between the fourth switching element and the plurality of second switching elements.

15. The RF signal switch of claim 12, wherein a gate width of the first switching elements is greater than a gate width of the second switching elements.

16. The RF signal switch of claim 12, wherein the first and second switching elements are metal-oxide-semiconductor transistors (MOSFETS) each having a reverse-connected diode connected between a gate electrode and a body electrode thereof.

17. The RF signal switch of claim 12, wherein the third and fourth switching elements are connected between the first node and the plurality of second switching elements.

18. A shunt switch, comprising:
a first node to which an alternating current signal is to be applied;
a second node to which a reference potential is to be applied;
a plurality of first switching elements connected in series between the first and second node;
a plurality of second switching elements connected in series between the first and second node, but not in series with the plurality of first switching element, the second switching elements configured to be in a conductive state when the first switching elements are in the conductive state and in a non-conductive state when the first switching elements are in the non-conductive state;
a third switching element connected in series with the plurality of second switching elements between the first and second nodes, the third switching element configured to be in a conduction state that is an opposite of the first switching elements; and
a fourth switching element connected in series with the plurality of second switching elements between the first and second nodes and in parallel with the third switching element, the fourth switching element configured to be in the conduction state that is the opposite of the first switching elements, wherein
the third switching element is a metal-oxide-semiconductor field effect transistor (MOSFET) having a drain terminal connected to a body terminal of said MOSFET, and
the fourth switching element is a metal-oxide-semiconductor transistor (MOSFET) having a source terminal connected to a body terminal of said MOSFET.

19. The shunt switch of claim 18, further comprising:
a first impedance element connected in series with the third switching element between the first and second nodes; and a second impedance element connected in series with the fourth switching element between the first and second nodes.

20. The shunt switch of claim 18, wherein each first switching element is a metal-oxide-semiconductor field effect transistor (MOSFET) having an impedance element connected between a source terminal and a drain terminal thereof, and each second switching element is a metal-oxide-semiconductor field effect transistor (MOSFET) having an impedance element connected between a source terminal and a drain terminal thereof.

\* \* \* \* \*